United States Patent
Shin et al.

(10) Patent No.: US 8,002,443 B2
(45) Date of Patent: Aug. 23, 2011

(54) LED ARRAY MODULE

(75) Inventors: Su-ho Shin, Seongnam-si (KR);
Chang-youl Moon, Suwon-si (KR);
Kyu-ho Shin, Seoul (KR); Soon-cheol Kweon, Seoul (KR); Seung-tae Choi, Osan-si (KR); Ki-hwan Kwon, Suwon-si (KR)

(73) Assignee: Samsung LED Co., Ltd., Suwon-si (KR)

( * ) Notice: Subject to any disclaimer, the term of this patent is extended or adjusted under 35 U.S.C. 154(b) by 146 days.

(21) Appl. No.: 11/473,188

(22) Filed: Jun. 23, 2006

(65) Prior Publication Data

US 2007/0001582 A1    Jan. 4, 2007

(30) Foreign Application Priority Data

Jul. 1, 2005  (KR) .................. 10-2005-0058991

(51) Int. Cl.
*F21V 29/00*   (2006.01)

(52) U.S. Cl. ....................... 362/294; 362/373

(58) Field of Classification Search ............ 362/294, 362/373, 800; 257/706, 712–722, 13, 59, 257/72, 79, 81, 99, 88–93, 918
See application file for complete search history.

(56) References Cited

U.S. PATENT DOCUMENTS

| | | | | |
|---|---|---|---|---|
| 5,763,951 A | * | 6/1998 | Hamilton et al. | 257/714 |
| 6,517,221 B1 | * | 2/2003 | Xie | 362/373 |
| 6,780,678 B2 | * | 8/2004 | Simon et al. | 438/122 |
| 7,172,320 B1 | * | 2/2007 | Roberts | 362/373 |
| 2004/0080939 A1 | * | 4/2004 | Braddell et al. | 362/240 |
| 2004/0213016 A1 | * | 10/2004 | Rice | 362/547 |
| 2004/0257808 A1 | * | 12/2004 | Bjornson et al. | 362/249 |
| 2005/0201097 A1 | * | 9/2005 | Kiraly et al. | 362/294 |
| 2006/0034085 A1 | * | 2/2006 | Wang et al. | 362/294 |
| 2006/0198161 A1 | * | 9/2006 | Lin | 362/613 |
| 2006/0262571 A1 | * | 11/2006 | Chen | 362/632 |
| 2007/0063338 A1 | * | 3/2007 | Chang et al. | 257/714 |

FOREIGN PATENT DOCUMENTS

JP    2005-078966 A    3/2005

* cited by examiner

*Primary Examiner* — Julie A Shallenberger
(74) *Attorney, Agent, or Firm* — Sughrue Mion, PLLC

(57) ABSTRACT

A light emitting diode (LED) array module includes a plurality of LEDs; and a substrate which mounts the LEDs and has a built-in cooling device for cooling heat generated when the LED is driven. The cooling device includes a heat radiation space formed on the substrate and a minute passage member which is wick- or mesh-structured to form a plurality of minute passages that operate by a heat pipe principle in the heat radiation space. The cooling device operating by the heat pipe principle is integrally formed on the substrate mounted with the LEDs, so heat radiation performance of the LEDs is enhanced, such that the LEDs can operate stably for a long time.

6 Claims, 6 Drawing Sheets

LED ARRAY MODULE

CROSS-REFERENCE TO RELATED APPLICATIONS

This application claims priority under 35 U.S.C. §119(a) of Korean Patent Application No. 2005-58991, filed Jul. 1, 2005, in the Korean Intellectual Property Office, the entire contents of which are incorporated herein by reference.

BACKGROUND OF THE INVENTION

1. Field of the Invention

An apparatus consistent with the present invention relates to a light emitting diode (LED) array module used for a backlight unit of a light crystal display (LCD).

2. Description of the Related Art

Advantageously, a light emitting diode (LED) has a long lifespan and requires less power consumption, which leads to a great deal of demand in the electric and electronic areas, and also in the advertising area. Recently, there have been active trials to use the LED for a backlight unit of a liquid crystal display (LCD). In the future, it is expected that LEDs will be widely used for daily life as indoor and outdoor lightings.

LEDs used in backlight units for LCD or in apparatuses require high power consumption. However, performance of LEDs exponentially decays according to rises in temperature. Accordingly, heat radiation of the LED should be appropriately considered.

FIG. 1 is one example of conventional LED array modules. As illustrated in FIG. 1, the conventional LED array module includes a substrate 2 having a plurality of LEDs 1 mounted therein, and a cooling module 3 for cooling the LED 1 by dissipating the heat generated by driving the LED 1. The cooling module 3 is attached to the substrate 2 by a thermal interface material 4. The cooling module 3 has a cooling unit, and the cooling unit may be a heat pipe in many cases. The heat pipe 5 is a high-performance heat transmitter for having more heat transfer rate then metals because it transmits the heat by using latent heat of working fluid in a sealed container. The inside of the heat pipe is Filled with the working fluid in a liquid and vapor state. The working fluid flows between a condensation unit and an evaporation unit by inter-gas pressure differences and surface tension of the liquid gas interface, and the heat is transferred without requiring a separate power supply. Such a heat pipe is simple in structure, light weight and requires little cost for maintenance, enjoying widespread popularity as the cooling unit among consumers.

The cooling unit may be a cooling water circulating device 6 as illustrated in FIG. 2. The heat generated by driving the plurality of LEDs 1 mounted in the substrate 2 is dissipated by the cooling water circulating between a cooling water entrance 6a and exit 6b of the cooling water circulating device 6.

The abovementioned conventional LED array module is formed with the thermal interface material 4 between the substrate 2 mounting the LED 1 and the cooling module 3. Generally, heat conductivity of the thermal interface material 4 is much lower than substances forming the substrate 2 and the cooling module 3. The heat radiation of the LED module deteriorates by rises in thermal resistance caused by the thermal interface material 4, thereby raising the temperature of the LED. Accordingly, the life of the LED module is shortened due to its poor heat radiation performance.

Also, when the substrate 2 and the cooling module 3 are attached by the thermal interface material 4, it is difficult to achieve uniform thickness therebetween and void trap may occur.

SUMMARY OF THE INVENTION

An aspect of the present invention is to address at least the above problems and/or disadvantages of the related art and to provide the advantages described below. Accordingly, an aspect of the present invention is to provide a light emitting diode (LED) array module achieving enhanced heat radiation by integrally forming a cooling device in a substrate mounting a LED.

In order to achieve the above-described aspects of the present invention, there is provided the light emitting diode (LED) array module comprising: a plurality of LEDs; and a substrate which mounts the LEDs and has a built-in cooling device for cooling heat generated when the LEDs are driven.

The cooling device uses a heat pipe principle or a fluid circulation structure.

In order to achieve the above-described aspects of the present invention, there is provided the light emitting diode (LED) array module comprising: a plurality of LEDs; a substrate which mounts the LEDs and forms a heat radiation space therein; and a minute passage member disposed in the heat radiation space and which provides a plurality of minute passages that operate by a heat pipe principle for heat radiation of the LEDs.

There is at least one heat radiation space.

The minute passage member may be wick- or mesh-structured.

The LED array module comprises a cover attached to the substrate to cover up the heat radiation space.

The substrate is formed with a conductive pattern with an insulating layer interposed therebetween, and the conductive pattern and the LEDs are electrically connected.

The LED array module may further comprise a lens for protecting the LEDs and inducing light radiated by the LEDs in a predetermined direction.

The LED array module may further comprise a heat sink attached to opposite sides of the substrate for heat radiation of the substrate; and a fan for cooling the heat sink.

In order to achieve the above-described aspects of the present invention, there is provided the light emitting diode (LED) array module comprising: a plurality of LEDs; a substrate which mounts the LEDs and forms a plurality of built-in minute passages that operate by a heat pipe principle for heat radiation of the LEDs; and a cover attached to the substrate to cover up the minute passages.

The minute passages may be approximately 100 μm wide.

In order to achieve the above-described aspects of the present invention, there is provided the light emitting diode (LED) array module comprising: a plurality of LEDs; a substrate which mounts the LEDs and forms a built-in substrate passage where a fluid circulates for heat radiation of the LEDs; and a fluid circulating unit for circulating the fluid through the substrate passage.

The fluid circulating unit comprises: a fluid storing unit connected to the substrate passage by the circulating passage; a pump disposed in the circulating passage; and a cooling unit for heat radiation of the fluid storing unit.

The cooling unit comprises: a heat sink attached to the fluid storing unit; and a fan for cooling the heat sink.

BRIEF DESCRIPTION OF THE DRAWING FIGURES

The above aspects and other features of the present invention will become more apparent by describing in detail exemplary embodiments thereof with reference to the attached drawing figures, wherein.

DETAILED DESCRIPTION OF EXEMPLARY EMBODIMENTS

Figure 1:
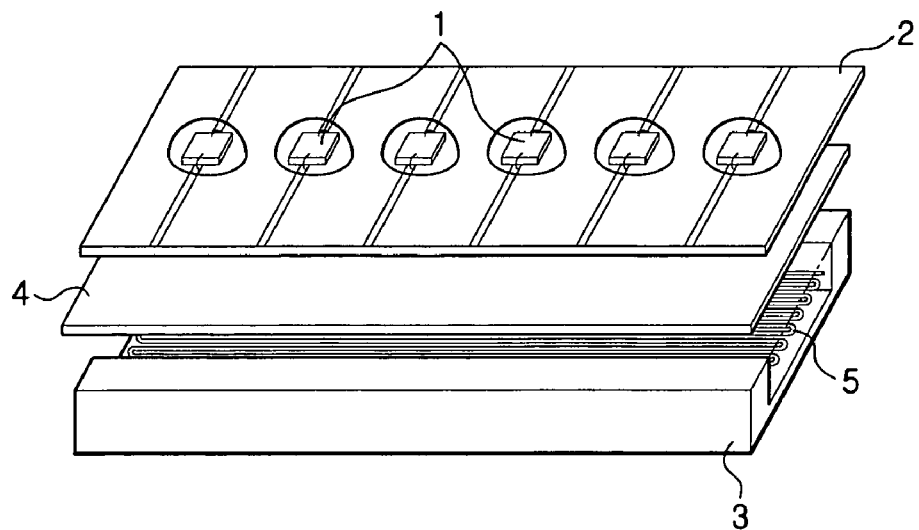
FIG. 1 is one example of a conventional LED array module.
Figure 2:
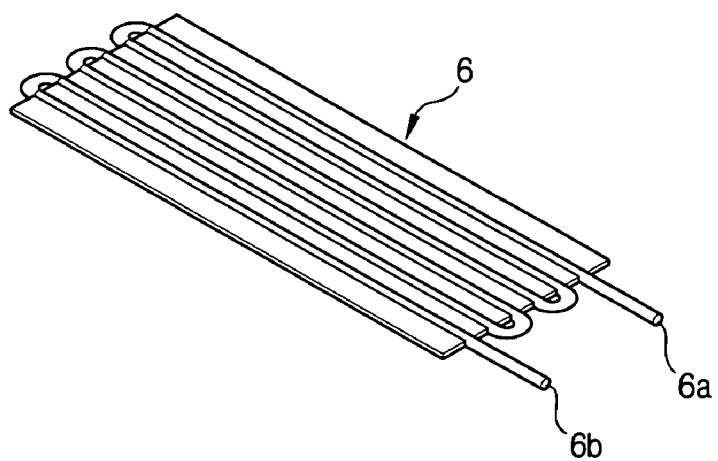
FIG. 2 is one example of a cooling device provided in the LED array module of FIG. 1.

Hereinafter, exemplary embodiments of the present invention will be described in detail with reference to the accompanying drawing figures.

In the following description, same drawing reference numerals are used for the same elements even in different drawings. The matters defined in the description such as a detailed construction and elements are provided to assist in a comprehensive understanding of the invention. Thus, it is apparent that the present invention can be carried out without those defined matters. Also, well-known functions or constructions are not described in detail since they are not necessary to understand the invention.

Figure 3:
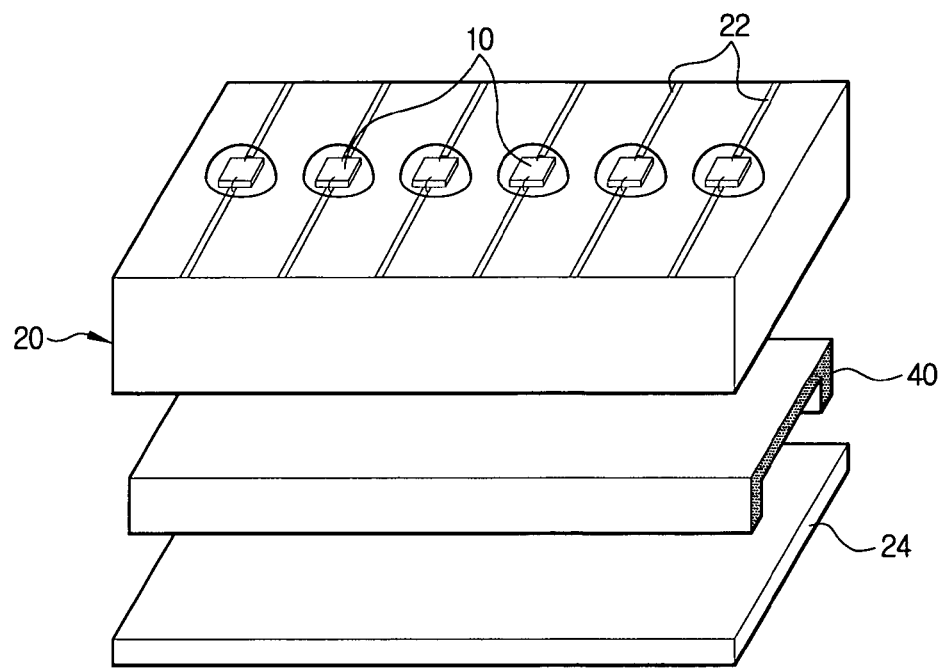
FIG. 3 is an exploded view of a LED array module according to one embodiment of the present invention.
Figure 4:
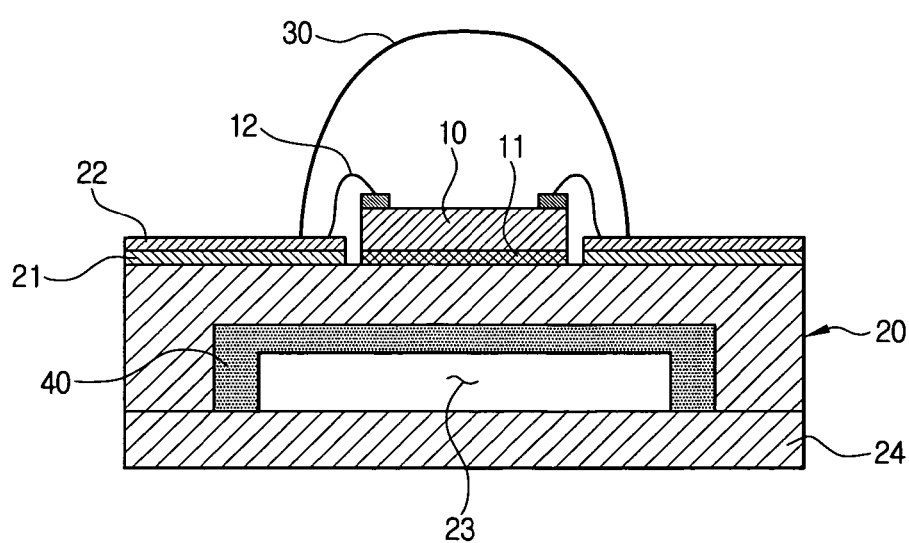
FIG. 4 is an enlarged view of assembled state of FIG. 3.

As illustrated in FIGS. 3 and 4, a light emitting diode (LED) according to one exemplary embodiment of the present invention includes a plurality of LEDs 10, a substrate 20 mounting the LEDs and having a built-in cooling device for cooling heat generated by driving the LEDs 10.

The LED 10 is bonded on the substrate 20 by a conductive thermal interface material 11. A conductive pattern 22 is formed on the substrate 20, with an insulating layer 21 interposed therebetween. The LED 10 is electrically connected to the conductive pattern 22 by a metal wire 12. The conductive thermal interface material 11 may be one of a silver epoxy, a silver paste and a solder.

A lens 30 is disposed on the substrate 20 to encompass the LED 10 in order to protect the LED 10 and induce light beams radiated from the LED in a predetermined direction. The lens 30 is shaped substantially like a hemisphere. The LED 10 may be formed by combining red, green and blue LEDs, or including many white LEDs.

The substrate 20 is formed with a predetermined heat radiation space 23 lengthwise therein. The heat radiation space 23 is in a groove form in which one end thereof is opened, and the opened part is attached with a cover 24.

The heat radiation space 23 is disposed with a minute passage member 40 for providing a minute passage operating as a heat pipe. The minute passage member 40 is wick or mesh-structured. The heat generated by driving LED 10 is transferred to the substrate 20, and the substrate is cooled fast by fluid passing the minute passage according to a heat pipe driving. The LED 10 is interposed with a highly conductive thermal interface material on the substrate 20 built with a cooling device therein. Therefore, the LED may be cooled more efficiently due to improvement of thermal resistance.

Figure 5:
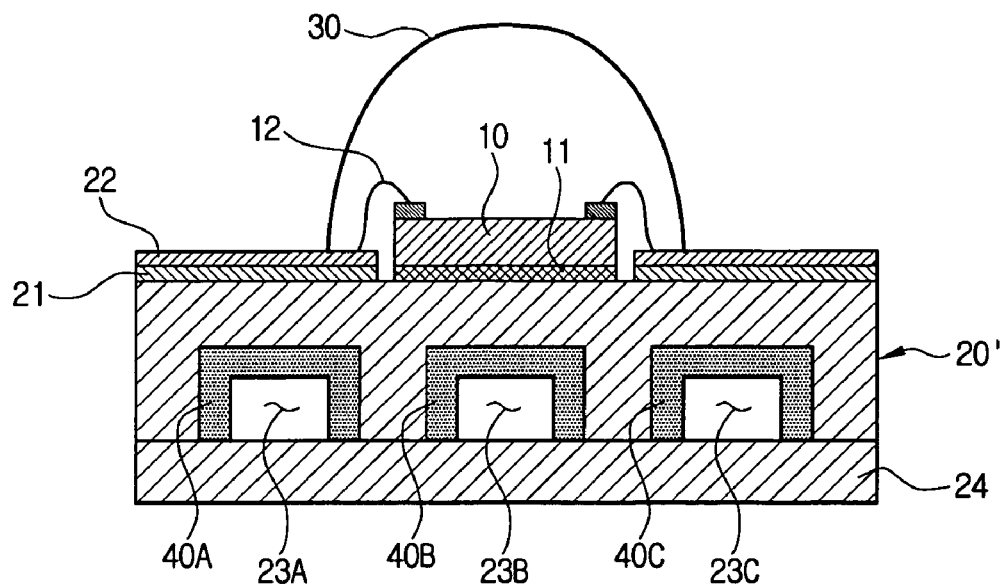
FIG. 5 shows a LED array module according to another embodiment of the present invention.

FIG. 5 shows a LED array module according to another exemplary embodiment of the present invention. As illustrated in FIG. 5, the basic structure of the LED array module is similar to that of the above-mentioned embodiment. The only differences are that in this further embodiment, a plurality of heat radiation spaces 23A, 23B and 23C are formed inside a substrate 20', and the heat radiation spaces 23A, 23B and 23C are disposed with minute passage members 40A, 40B and 40C, respectively. The same drawing reference numerals are used for elements where their structures are the same as those of the previous embodiment, and will not be described in detail.

Figure 6:
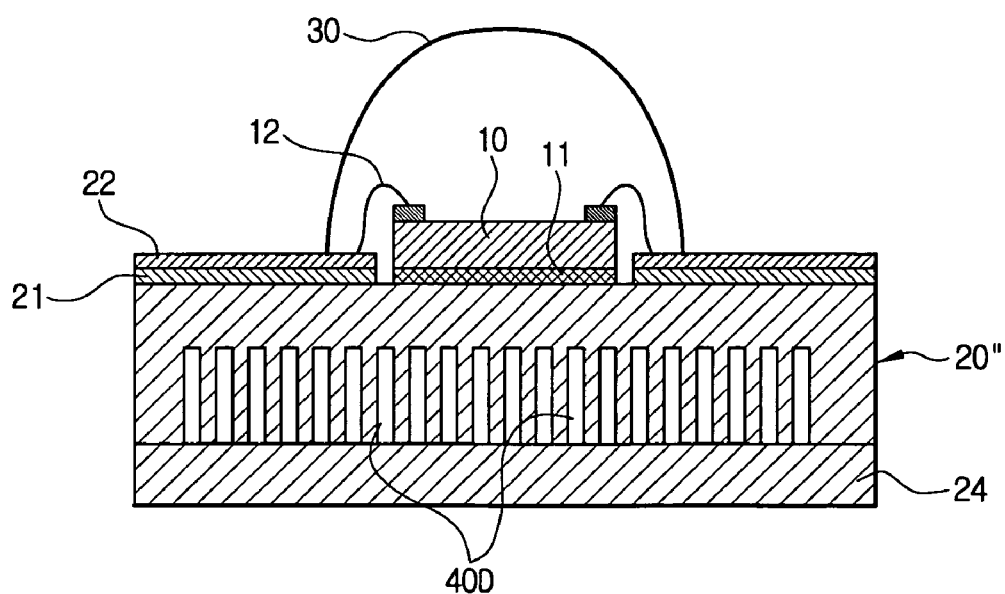
FIG. 6 is a LED array module according to yet another embodiment of the present invention.

FIG. 6 is an LED array module according to yet another exemplary embodiment of the present invention. As illustrated in FIG. 6, the LED array module according to this embodiment of the present invention has same structures to the abovementioned embodiments, except for a plurality of minute passages 40D operating as a heat pipe which is directly formed on the substrate 20''. The minute passage 40D is formed approximately 100 μm wide. Surface tension is formed at edges of each minute passage 40D, which induces a cooling operation by the heat pipe driving principle as abovementioned. In this embodiment of the present invention, the same drawing reference numerals are used for elements where their structures are the same as those of the embodiment of FIGS. 3 and 4, and will not be described in detail.

Figure 7:
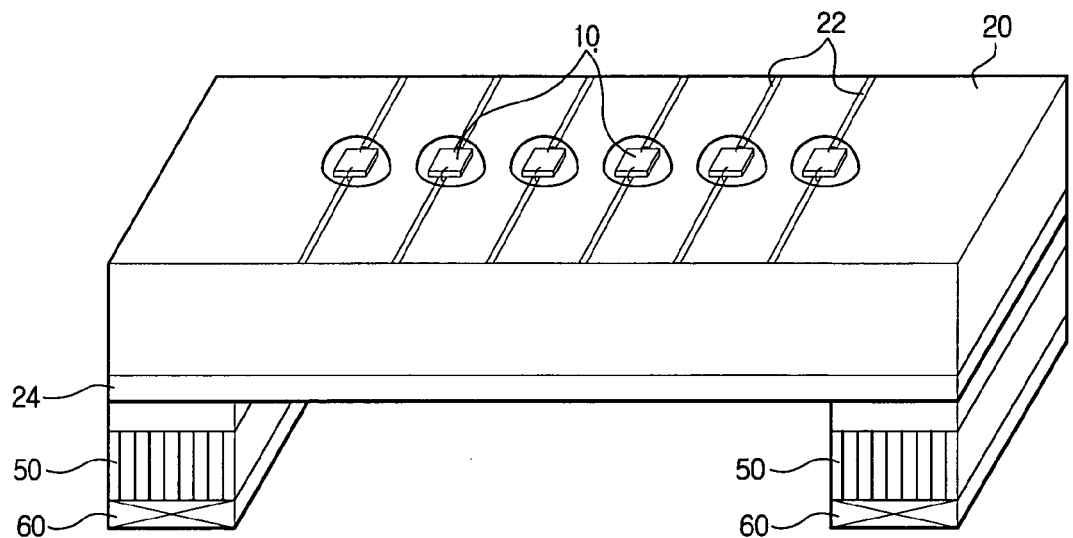
FIG. 7 is a perspective view of a LED array module according to yet another embodiment of the present invention.

FIG. 7 is a perspective view of an LED array module according to yet another exemplary embodiment of the present invention. This embodiment has a heat sink 50 and a fan 60 for furthering heat radiation as in the several above-mentioned embodiments including a cooling device using a heat pipe principle.

Two heat sinks 50 are attached to a lower side of the substrate 20; that is, both ends of an opposite side to the LED 10-disposed surface. Each heat sink 50 has the fan 60 attached thereto for cooling the heat sink 50. Likewise, it is possible to enhance heat radiation by securing a large heat radiation area by the heat sinks 50 and forcibly cooling the heat sinks 50 with the fan 60. Though not described in detail in this embodiment of the present invention, the inside of the substrate 20 is formed with one of the structures of the cooling devices in FIGS. 4, 5 and 6.

Figure 8:
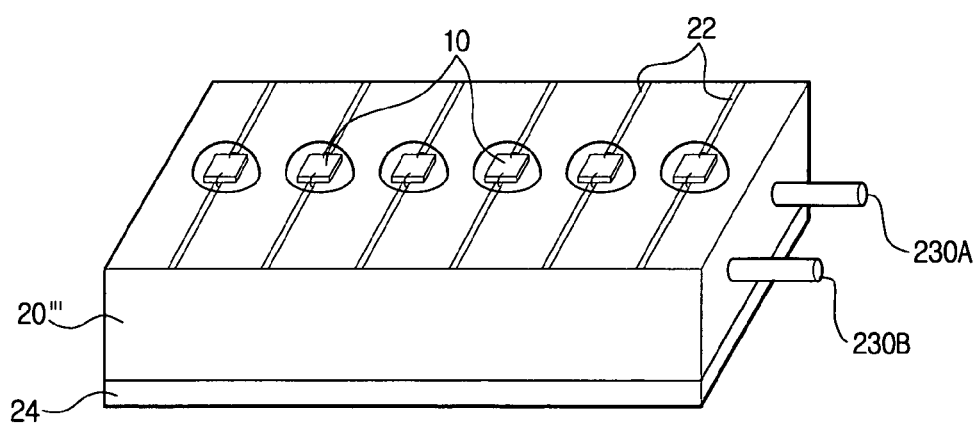
FIG. 8 is a perspective view of a LED array module according to another embodiment of the present invention.
Figure 9:
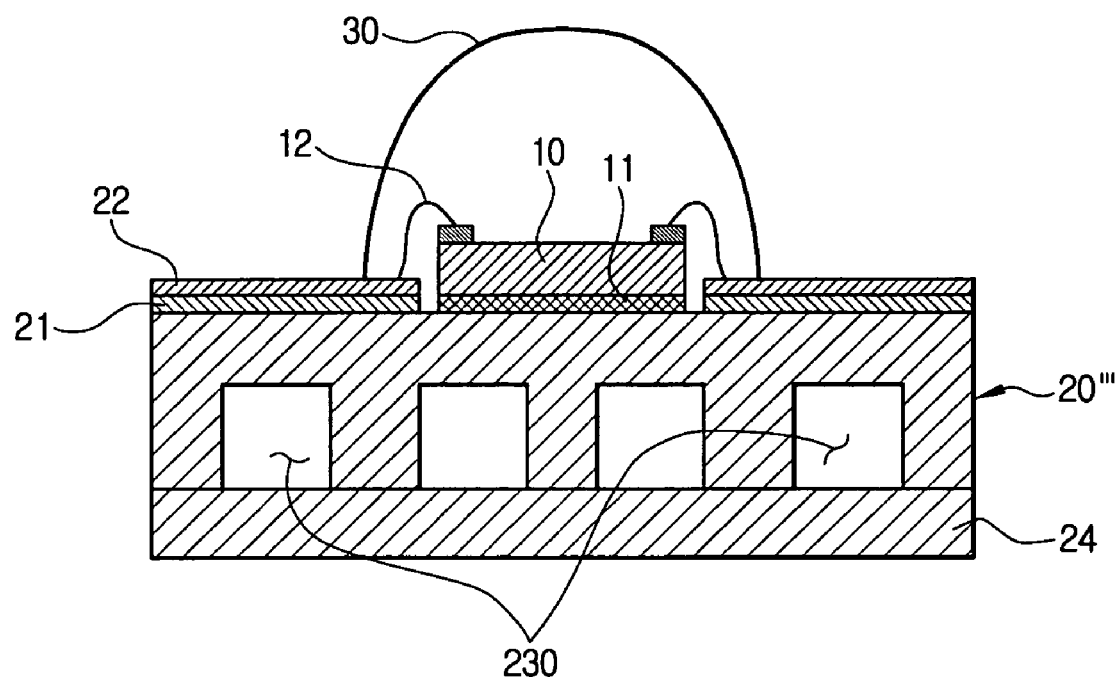
FIG. 9 is a cross section view of FIG. 8.
Figure 10:
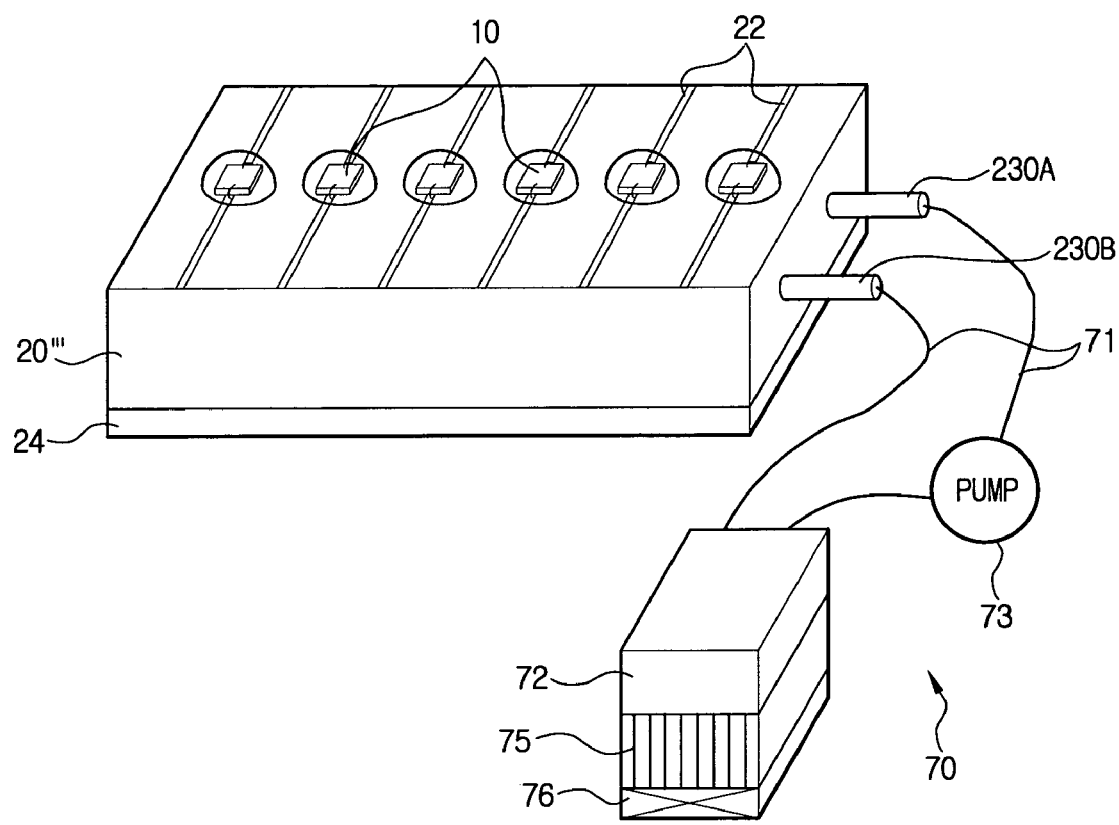
FIG. 10 is a perspective view of a LED array module connected with a fluid circulating unit of FIG. 8.

FIGS. 8 through 10 are views of the LED array module according to a further exemplary embodiment of the present invention. As illustrated in FIGS. 8 through 10 according to this exemplary embodiment of the present invention, the LED array module is formed with a plurality of substrate passages 230 inside a substrate 20'''. The LED array module includes a fluid circulating unit 70 for circulating a fluid through the substrate passages 230. The fluid may be, but is not limited to, water, alcohol and inactive liquid such as FC-72 and FC-77 (product names).

The substrate passage 230 is formed to circulate inside the substrate 20''' for even cooling. A lower side of the substrate passage 230 is covered up by a cover 24. One side of the substrate 20 is formed with a substrate passage entrance and exit 230A and 230B.

A fluid circulating unit 70 includes a circulating passage 71 connected to the substrate passage entrance and exit 230A and 230B, a fluid storing unit 72 connected to the substrate passage 230 by the circulating passage 71, and a pump 73 disposed in the middle of the circulating passage 71.

As the pump 73 operates, the fluid in the fluid storing unit 72 flows into the substrate passage 230 through the substrate passage entrance 230A. The fluid in the substrate passage 230 flows out of the substrate passage exit 230B and recollects in the fluid storing unit 72.

The fluid storing unit 72 is attached with a heat sink 75 for heat radiation to the outside, and a fan 76 for forcibly cooling the heat sink 75 is attached to the heat sink 75.

Accordingly, heat generated by driving the LED 10 may be efficiently cooled by a fluid circulating structure where relatively high-temperature fluid in the substrate passage 230 recollects in the fluid storing unit 72, is cooled by the heat sink 75 and returns to the substrate passage 230 by the pump 73.

As abovementioned, according to exemplary embodiments of the present invention, it is possible to maintain a low operation temperature of the LED because the heat generated at the LED can be radiation effectively by mounting the LED in a substrate integrally formed with the cooling device using fluid circulation to cool the LED. Accordingly, heat radiation performance of the LED is enhanced and the LED is stably operated for a long time.

While the invention has been shown and described with reference to exemplary embodiments thereof, it will be understood by those skilled in the art that various changes in form and details may be made therein without departing from the spirit and scope of the invention as defined by the appended claims.

What is claimed is:

1. A light emitting diode (LED) array module comprising:
   a plurality of LEDs;
   a substrate having a first surface and a second surface opposite the first surface, the plurality of LEDs disposed on the first surface;
   a cover disposed on the second surface, wherein the substrate comprises:
      a first recess formed in the second surface; and
      a cooling passage member having a structure through which a cooling fluid can pass, the cooling passage member formed to contact a lower surface and a side surface of the first recess, and the cooling passage member bent to form a second recess, and
   wherein the cover disposed on the second surface encloses the second recess to generate a cavity-shaped heat radiation space between the cooling passage member and the cover, and
   the cooling fluid is unable to pass through the cavity-shaped heat radiation space.

2. The LED array module of claim 1, wherein the cooling passage uses a heat pipe principle.

3. The LED array module of claim 1, wherein the cooling passage uses a fluid circulation structure.

4. A light emitting diode (LED) array module comprising:
   a plurality of LEDs;
   a substrate having a first surface and a second surface opposite the first surface, the plurality of LEDs disposed on the first surface;
   a cover disposed on the second surface,
   wherein the substrate comprises:
      a plurality of first recesses formed in the second surface; and
      a plurality of cooling passage members respectively having a structure through which a cooling fluid can pass, the plurality of cooling passage members respectively formed to contact lower surfaces and side surfaces of the plurality of first recesses, and the plurality of cooling passage members respectively bent to form a plurality of second recess, and
   wherein the cover disposed on the second surface encloses the plurality of second recesses to respectively generate a plurality of cavity-shaped heat radiation spaces between the plurality of cooling passage members and the cover, and
   the cooling fluid is unable to pass through the plurality of cavity-shaped heat radiation spaces.

5. The LED array module of claim 4, wherein the plurality of cooling passage members are one of wick-and mesh-structured.

6. The LED array module of claim 4, further comprising:
   an insulating layer disposed on the first surface;
   a conductive pattern disposed on the insulating layer; and
   a plurality of lenses respectively covering the plurality of LEDs, the conductive pattern electrically connected to the plurality of LEDs.

* * * * *